(12) United States Patent
Koh et al.

(10) Patent No.: US 8,402,411 B1
(45) Date of Patent: *Mar. 19, 2013

(54) REPORTING OF ASPECTS AND PARTITIONING OF AUTOMATICALLY GENERATED CODE ACCORDING TO A PARTITIONING SCHEME

(75) Inventors: David Koh, Boston, MA (US); Donald Paul Orofino, II, Sudbury, MA (US); Zijad Galijasevic, Shrewsbury, MA (US)

(73) Assignee: The MathWorks, Inc., Natick, MA (US)

( * ) Notice: Subject to any disclaimer, the term of this patent is extended or adjusted under 35 U.S.C. 154(b) by 592 days.

This patent is subject to a terminal disclaimer.

(21) Appl. No.: 12/072,826

(22) Filed: Feb. 28, 2008

Related U.S. Application Data

(63) Continuation of application No. 11/025,747, filed on Dec. 29, 2004, now Pat. No. 7,350,172.

(60) Provisional application No. 60/611,907, filed on Sep. 20, 2004.

(51) Int. Cl.
 *G06F 17/50* (2006.01)

(52) U.S. Cl. .................................... 716/118; 716/124
(58) Field of Classification Search ........ 716/7, 101–105
 See application file for complete search history.

(56) References Cited

U.S. PATENT DOCUMENTS

| | | | |
|---|---|---|---|
| 5,835,755 A * | 11/1998 | Stellwagen, Jr. | 707/764 |
| 6,647,508 B2 | 11/2003 | Zalewski et al. | |
| 6,862,696 B1 | 3/2005 | Voas et al. | |
| 7,007,183 B2 | 2/2006 | Rawson, III | |
| 7,051,309 B1 * | 5/2006 | Crosetto | 716/122 |
| 7,584,446 B2 * | 9/2009 | Crosetto | 716/100 |
| 2004/0111710 A1 | 6/2004 | Chakradhar et al. | |

* cited by examiner

*Primary Examiner* — Binh Tat
(74) *Attorney, Agent, or Firm* — Nelson Mullins Riley & Scarborough LLP

(57) ABSTRACT

A method and system are described for generating a performance prediction report to assist finalizing a partitioning scheme of a block diagram model. Providing a user-defined partitioning scheme and information describing a target hardware platform used in that partitioning scheme, the present invention can generate a performance prediction report by analyzing the computational characteristics of the block diagram model.

20 Claims, 11 Drawing Sheets

Interface Loading

Interface 1: p1-p2

|  | Size | Transfer Time | Processing Interval | Percent Used |
|---|---|---|---|---|
| S4 | 10000 Bytes | 2.0 milliseconds | 10.0 milliseconds | 20% |
| *Total* | *10000* | *2.0milliseconds* | *10.0milliseconds* | *20%* |

Interface 3: p2-p4

|  | Size | Transfer Time | Processing Interval | Percent Used |
|---|---|---|---|---|
| S8 | 10000 Bytes | 2.0 milliseconds | 10.0 milliseconds | 20% |
| *Total* | *10000* | *2.0milliseconds* | *10.0milliseconds* | *20%* |

Interface 5: p3-p4

|  | Size | Transfer Time | Processing Interval | Percent Used |
|---|---|---|---|---|
| S2 | 10000 Bytes | 2.0 milliseconds | 10.0 milliseconds | 20% |
| S10 | 10000 Bytes | 2.0 milliseconds | 10.0 milliseconds | 20% |
| *Total* | *20000* | *4.0milliseconds* | *10.0milliseconds* | *40%* |

Interface 7: p1-p3

|  | Size | Transfer Time | Processing Interval | Percent Used |
|---|---|---|---|---|
| S2 | 10000 Bytes | 2.0 milliseconds | 10.0 milliseconds | 20% |
| S6 | 10000 Bytes | 2.0 milliseconds | 10.0 milliseconds | 20% |
| *Total* | *20000* | *4.0milliseconds* | *10.0milliseconds* | *40%* |

*Fig. 7C*

Computational Utilization

Partition 1

|  | Processing Time | Processing Interval | Percent Used |
|---|---|---|---|
| Block 1 | 4.0milliseconds (mS) | 10.0mS | 40.00% |
| Block 2 | 2.0mS | 10.0mS | 20.00% |
| *Total* | *6.0mS* | *10.0mS* | *60.00%* |

Partition 2

|  | Processing Time | Processing Interval | Percent Used |
|---|---|---|---|
| Block 5 | 5.0milliseconds (mS) | 10.0mS | 50.00% |
| Block 6 | 1.0mS | 10.0mS | 10.00% |
| *Total* | *6.0mS* | *10.0mS* | *60.00%* |

Partition 3

|  | Processing Time | Processing Interval | Percent Used |
|---|---|---|---|
| Block 7 | 5.0milliseconds (mS) | 10.0mS | 50.00% |
| Block 8 | 1.0mS | 10.0mS | 10.00% |
| *Total* | *6.0mS* | *10.0mS* | *60.00%* |

Partition 4

|  | Processing Time | Processing Interval | Percent Used |
|---|---|---|---|
| Block 3 | 5.0milliseconds (mS) | 10.0mS | 50.00% |
| Block 4 | 1.0mS | 10.0mS | 10.00% |
| Block 9 | 1.0mS | 10.0mS | 10.00% |
| *Total* | *7.0mS* | *10.0mS* | *70.00%* |

*Fig. 7D*

Memory Usage

| Partition 1 | Local Memory | Size | Capacity | Percent Used |
|---|---|---|---|---|
| | Block 1 (program) | 1237 Bytes | 65536 Bytes | 1.89% |
| | Block 2 (program) | 2048 | 65536 Bytes | 3.13% |
| | S1 (data) | 10000 | 65536 Bytes | 6.25% |
| | S2 (data) | 10000 | 65536 Bytes | 6.25% |
| | S4 (data) | 10000 | 65536 Bytes | 6.25% |
| | S6 (data) | 10000 | 65536 Bytes | 6.25% |
| | STACK | 4096 | 65536 Bytes | 6.25% |
| | CONSTANTS | 4590 | 65536 Bytes | 7.00 % |
| | *Total* | *51971* | 65536 Bytes | *79.30%* |

| Partition 2 | Local Memory | Size | Capacity | Percent Used |
|---|---|---|---|---|
| | Block 5 (program) | 3676 Bytes | 65536 Bytes | 5.61% |
| | Block 6 (program) | 2568 | 65536 Bytes | 3.92% |
| | S4 (data) | 10000 | 65536 Bytes | 6.25% |
| | S5 (data) | 10000 | 65536 Bytes | 6.25% |
| | S8 (data) | 10000 | 65536 Bytes | 6.25% |
| | STACK | 4096 | 65536 Bytes | 6.25% |
| | CONSTANTS | 536 | 65536 Bytes | 0.08 % |
| | *Total* | *40876* | 65536 Bytes | *62.37%* |

| Partition 3 | Local Memory | Size | Capacity | Percent Used |
|---|---|---|---|---|
| | Block 7 (program) | 3676 Bytes | 65536 Bytes | 5.61% |
| | Block 8 (program) | 2568 | 65536 Bytes | 3.92% |
| | S2 (data) | 10000 | 65536 Bytes | 6.25% |
| | S6 (data) | 10000 | 65536 Bytes | 6.25% |
| | S7(data) | 10000 | 65536 Bytes | 6.25% |
| | S10 (data) | 10000 | 65536 Bytes | 6.25% |
| | STACK | 4096 | 65536 Bytes | 6.25% |
| | CONSTANTS | 536 | 65536 Bytes | 0.08 % |
| | *Total* | *50876* | 65536 Bytes | *77.63%* |

| Partition 4 | Local Memory | Size | Capacity | Percent Used |
|---|---|---|---|---|
| | Block 3 (program) | 3676 Bytes | 65536 Bytes | 5.61% |
| | Block 4(program) | 2568 | 65536 Bytes | 3.92% |
| | Block 9 (program) | 1345 | 65536 Bytes | 2.05% |
| | S2 (data) | 10000 | 65536 Bytes | 6.25% |
| | S3 (data) | 10000 | 65536 Bytes | 6.25% |
| | S8(data) | 10000 | 65536 Bytes | 6.25% |
| | S9 (data) | 10000 | 65536 Bytes | 6.25% |
| | S10 (data) | 10000 | 65536 Bytes | 6.25% |
| | STACK | 4096 | 65536 Bytes | 6.25% |
| | CONSTANTS | 536 | 65536 Bytes | 0.08 % |
| | *Total* | *62221* | 65536 Bytes | *95.12%* |

*Fig. 7E*

REPORTING OF ASPECTS AND PARTITIONING OF AUTOMATICALLY GENERATED CODE ACCORDING TO A PARTITIONING SCHEME

RELATED APPLICATION

This application claims priority to, and the benefit of, U.S. patent application Ser. No. 11/025,747, filed on Dec. 29, 2004, and U.S. Provisional Application No. 60/611,907, filed on Sep. 20, 2004, for all subject matter common to both applications. The disclosure of the above-mentioned application is hereby incorporated by reference herein in their entirety.

TECHNICAL FIELD OF INVENTION

The present invention relates to a method and system for partitioning a block diagram model and generating reports to assist in partitioning the block diagram model.

BACKGROUND

In graphical modeling environments, such as a model-based design tool, block diagram models can be created to represent a design, or algorithm, of an implementation for a computational hardware. One or more block diagram models may represent a design for a target hardware platform. A target hardware platform used in this application may include a single computational hardware component or multiple computational hardware components. A target hardware platform may also have other elements such as memory, interfaces, or other integrated circuits (ICs). A computational hardware component is used to mean any hardware component with computational capability, such as a digital signal processor (DSP), general-purpose processor (GPP), microcontroller, application specific integrated circuit, field-programmable gate arrays (FPGA) or the like.

An automatic code generation application can automatically generate code and build programs from the block diagram model for implementation on the computational platform based on the design. In this manner, the design of a block diagram model behaves as an implementation specification for automatic code generation. A graphical block diagram modeling environment can be used to produce designs and algorithms that can be implemented on computational hardware components such as DSPs, GPPs, microcontrollers, ASICs, or FPGAs.

For a model-based design that represents a computational algorithm intended for implementation on a single computational component, such as one processor, the automatically generated code implementation of the design can be relatively straightforward. However, a block diagram model may represent a design for implementation on a hardware platform that may include multiple computational hardware components, for example, an embedded control system with multiple different processors and FPGAs. In another example, a block diagram model design which may be implemented in code to run on a single processor instead may be retargeted to run on multiple processors for a variety of design reasons, such as quality, cost, speed, etc. In these examples of multiple computational hardware components, it is much more challenging and difficult to generate an implementation by automatic code generation, from a model-based design since the implementation is dependent on the topology of the hardware. An arbitrary partitioning of a block diagram model across the multiple computational hardware components or a partitioning scheme that does not consider attributes of one or more computational hardware components may not yield intended results and fail to meet certain design requirements.

The process of partitioning a block diagram model is not a trivial task because there are many degrees of freedom one can consider to partition a block diagram model. Requirements of a block diagram model, such as input and output signal rates, timing constraints, computational load, maximum system latency, and attributes of a target hardware platform, such as computational processing capacity of each computational component, the speed of different interfaces, the type and size of memory, are variables one may consider while determining a partitioning scheme of a block diagram model. Moreover, with the wide range of possible combinations of processor and integrated circuit (IC) components that can reside on a target hardware platform, the partitioning of a model-based design is further complicated as these components can be interfaced together by a wide range of different types of physical, communication and control interfaces.

Furthermore, computational hardware components, such as GPPs, microcontrollers, and DSPs, often include one or more types of memory with varying memory access rates. For example, an embedded system may have DSPs, where each processor may contain on-chip random access memory (RAM) and/or read-only memory (ROM). Furthermore, each DSP may also access external RAM memory and the multiple DSPs may share the same external memory. On-chip internal memory is typically faster but smaller in size than the external memory. How code and data are placed in memory affects the performance of a model-based design implementation and the burden on the partitioning, in terms of memory mappiong, of the model further increases.

It is often burdensome to translate a model created in the graphical modeling application to a format suitable for execution on a target hardware platform. This burden becomes greater when the code representative of the model is partitioned across multiple computational components. This process of partitioning is often performed in manual trial-and-error fashion with little or no assurance of convergence to an optimal solution or a suitable solution. Given a specific model design, it is often hard to discern whether a particular target hardware platform is suited for the implementation of a specific design without actually testing the implementation on the target hardware platform. It is often impractical, costly and time consuming to acquire multiple hardware platforms variants to perform actual trial implementations. Additionally, the hardware platform may not be available. On the other hand, given a particular target hardware platform, it is hard to determine whether a design will execute as intended on the particular target hardware platform without actually generating code from the model design and executing the code on the target hardware platform. Therefore, there is a need for a tool that provides a quantitative assessment of any candidate partitioning scheme on the target hardware platform prior to code generation and actual execution.

SUMMARY OF THE INVENTION

The present invention provides a method and system for generating a performance prediction report of a partitioning scheme of a block diagram model before any code is generated and executed on the target hardware platform. A partitioning scheme is a representation of how the block diagram model is to be partitioned across multiple components, such as computational hardware components or memory components of the target hardware platform. The data presented in the performance prediction report provides metrics that assist a user to arrive at a desirable partitioning scheme and actual partitioning for a block diagram model in a graphical modeling environment.

To practice the present invention, information about the attributes of a selected target hardware platform is needed for performance analysis. Specifications of a target hardware platform may include any objective properties of each the computational hardware component of the target hardware platform, such as processor clock rate, internal memory size of a particular computational hardware component, and the like. Additionally, the present invention analyzes the computational requirements, memory sizing, and data routing aspects of the model and applies this information to predict the operational performance of a candidate partitioning scheme on the selected computational hardware components.

Specifically, the performance prediction report can provide memory utilization, interface loading, and throughput estimates of a user-defined partitioning scheme, and a user can further specify the granularity of the data in the report to be represented. The level of granularity can be any of a block, a subsystem, a model, or other unit element within the block diagram model. Based on the report, the user can choose to modify the partitioning scheme, selection of computational hardware component, and/or the block diagram model to achieve a user-specific goal.

Given a particular partitioning scheme for a model design, the present invention allows a user to estimate the performance of one or more computational hardware components knowing the specifications of these components. Thus, the present invention provides a user a tool to determine what type of target hardware platform resource is required to satisfy requirements of the model design without an explicit implementation trial (generating code and executing the generated code) on any hardware platform. On the other hand, many partitioning schemes for a given model design may be assessed for a particular hardware platform without explicit implementation trials on the particular hardware platform.

In one embodiment of the present invention, a method for generating a report on a partitioning scheme for a block diagram model is provided. The method includes the step of providing information describing a target hardware platform. The method further includes the step of providing the partitioning scheme for said block diagram model. The method also includes the step of generating a performance prediction report predicting one or more operational characteristics of the target hardware platform when executing a representation of the block diagram model on the target hardware platform based on the partitioning scheme.

In one aspect of the present invention, the target hardware platform includes one or more computational hardware components. In another aspect of the present invention, the target hardware platform includes one or more interfaces. In one aspect of the present invention, the information describing the target hardware platform is received from a storage location, from a user input, via an API call to the target hardware platform or any combination thereof. In another aspect of the present invention, the information describing the target hardware platform includes any one of memory information, interface information, processing speed information of a computational hardware component or any combination thereof.

In one aspect of the present invention, the memory information includes a description of a size of a memory element and/or an access speed of the memory element. In another aspect of the present invention, the interface information includes a description of a type of an interface element, a speed of the interface element, and/or two hardware components that use the interface element to communicate with each other. In still another aspect of the present invention, the processing speed information includes a description of a clock rate and/or a processor speed of the computational hardware component.

In one aspect of the present invention, the performance prediction report indicates any one of insufficient memory in a computational hardware component for a segment of code generated from the block diagram model, overloading of an interface, excess CPU usage of a computational hardware component, failure to meet a system requirement, failure to meet a user preference or a combination thereof.

In one aspect of the present invention, the partitioning scheme represents a memory mapping scheme for associated code and data of the block diagram model. In another aspect of the present invention, the one or more operational characteristics of the target hardware platform includes any one of memory usage, data transfer times, throughput of the block diagram model or a combination thereof. In still another aspect of the present invention, the one or more operational characteristics of the target hardware platform are presented in the performance prediction report at a granularity level of any one of a block, a partition, a subsystem, a model or any combination thereof.

In one aspect of the present invention, the performance prediction report includes a timing diagram showing interface loading and computational hardware component usage as a function of time. In another aspect of the present invention, the partitioning scheme partitions said block diagram model into two or more partitions.

In one embodiment of the present invention, the method for generating a report on a partitioning scheme for a block diagram model further includes the step of modifying at least one of the block diagram model, the information describing the target hardware platform, and the partitioning scheme to reach a user-specific goal. In another embodiment of the present invention, the method includes the step of generating code from the block diagram model for execution by the target hardware platform. In still another embodiment of the present invention, the method includes the step of executing the code on the target hardware platform, and generating a statistical report presenting one or more real-time operational characteristics of the target hardware platform. In yet another embodiment of the present invention, the method includes the step of comparing at least one of the one or more predicted operational characteristics with at least one of the one or more real-time operational characteristics. In still another embodiment of the present invention, the method includes the step of altering generation mechanics of the performance prediction report to generate other prediction results based on the comparison of the at least one of the one or more predicted characteristics with the at least one of the one or more real-time operational characteristics. In yet another embodiment of the present invention, the method further includes the step of modifying at least one of the partitioning scheme, the block diagram model, and the information describing the target hardware platform based on the comparison of the at least one of the one or more predicted characteristics with the at least one of the one or more real-time operational characteristics.

In one embodiment of the present invention, a method for obtaining a report on a partitioning scheme for a block diagram model is provided. The method includes the step of providing information describing a target hardware platform. The method further includes the step of defining the partitioning scheme for said block diagram model. The method also includes the step of partitioning said block diagram model based on the partitioning scheme. The method includes the step of receiving a report predicting one or more operational characteristics of the target hardware platform when executing the block diagram model based on the partitioning scheme.

In one aspect of the present invention the partitioning scheme is a user-defined partitioning scheme. In another aspect of the present invention, the information describing the target hardware platform is provided from a storage location, from user input, via an API call to the target hardware platform or any combination thereof. In yet another aspect of the present invention, the partitions are represented by a graphical representation. In one embodiment of the present invention, the method for obtaining a report on a partitioning scheme for a block diagram model further includes the step of modifying at least one of the block diagram model, information of the target hardware platform, and the partitioning scheme based on the report.

In one embodiment of the present invention, a medium in an electronic device holding computer executable instructions for a method generating a report on a partitioning scheme for a block diagram model is provided. The method includes the step of providing information describing a target hardware platform. The method further includes the step of providing the partitioning scheme for said block diagram model. The method also includes the step of generating a performance prediction report predicting one or more operational characteristics of the target hardware platform when executing a representation of the block diagram model based on the partitioning scheme.

In one embodiment of the present invention, a system for generating a report on a partitioning scheme for a block diagram model is described. The system includes an application for manipulating the block diagram model, a build tool for receiving the partitioning scheme and information describing a target hardware platform, and a report generator for generating a performance prediction report predicting one or more operational characteristics of the target hardware platform when executing a representation of the block diagram model based on the partitioning scheme.

In one aspect of the present invention, the target hardware platform includes one or more computational hardware components. In another aspect of the present invention, the target hardware platform includes one of one or more interfaces. In one aspect of the present invention, the information describing the target hardware platform is received from a storage location, from a user input, via an API call to the target hardware platform or any combination thereof. In another aspect of the present invention, the information describing the target hardware platform includes any one of memory information, interface information, processing speed information of a computational hardware component or any combination thereof.

In one aspect of the present invention, the memory information includes a description of a size of a memory element and/or an access speed of the memory element. In another aspect of the present invention, the interface information includes a description of a type of an interface element, a speed of the interface element, and/or two hardware components that use the interface element to communicate with each other. In still another aspect of the present invention, the processing speed information includes a description of a clock rate and/or a processor speed of the computational hardware component.

In one aspect of the present invention, the performance prediction report indicates any one of insufficient memory in a computational hardware component for a segment of code generated from the block diagram model, overloading of an interface, excess CPU usage of a computational hardware component, failure to meet a system requirement, failure to meet a user preference or a combination thereof.

In one aspect of the present invention, the partitioning scheme represents a memory mapping scheme for associated code and data of the block diagram model. In another aspect of the present invention, the one or more operational characteristics of the target hardware platform includes any one of memory usage, data transfer times, throughput of the block diagram model or a combination thereof. In still another aspect of the present invention, the one or more operational characteristics of the target hardware platform are presented in the performance prediction report at a granularity level of any one of a block, a partition, a subsystem, a model or a combination thereof.

In one aspect of the present invention, the performance prediction report includes a timing diagram showing interface loading and computational hardware component usage as a function of time. In another aspect of the present invention, the partitioning scheme partitions said block diagram model into two or more partitions.

In one aspect of the present invention, the build tool generates code of the block diagram model for execution by the target hardware platform. In another aspect of the present invention, the report generator generates a statistical report presenting one or more real-time operational characteristics of the target hardware platform after the code is executed on the target hardware platform. In still another aspect of the present invention, the report generator compares at least one of the one or more predicted operational characteristics with at least one of the one or more real-time operational characteristics. In yet another aspect of the present invention, the report generator alters generation mechanics of the performance prediction report to generate another prediction results upon comparing the at least one of the one or more predicted operational characteristics with the at least one of the one or more real-time operational characteristics. In still another aspect of the present invention, the partitioning scheme is user-defined partitioning scheme.

BRIEF DESCRIPTION OF FIGURES

The illustrative embodiments of the present invention will be described below relative to the following drawings.

FIG. 7C illustrates an exemplary memory usage report corresponding to the exemplary partitioning scheme in FIG. 7A.

FIG. 7D illustrates an exemplary computational utilization report corresponding to the exemplary partitioning scheme in FIG. 7A.

FIG. 7E illustrates an exemplary interface loading report corresponding to the exemplary partitioning scheme in FIG. 7A.

DETAILED DESCRIPTION

The present invention discloses a method and system for generating a performance prediction report to assist in evaluating a partitioning scheme of a block diagram model. Given the specification description of a target hardware platform and a partitioning scheme, the present invention relates the given information and data to the computational characteristics of the block diagram model, and generates a performance prediction report predicting the operational characteristics of the computational hardware platform running code automatically generated from the block diagram model. The present invention applies to one or more computational hardware components with both like processors and unlike processors. The present invention also applies to other computational hardware components such as FPGAs, ASICs, and the like. The present invention also applies to a hardware platform comprising both processors and IC devices such as FPGAs and ASICs. The present invention enables a user to make further changes to the partitioning scheme or the block diagram model after reviewing the performance prediction report to achieve a user-specific partitioning goal.

For example, a user wants to achieve lowest possible system latency (the delay between when an input enters the system and when its corresponding output is emitted by the system) for a block diagram model, but unfortunately, the fastest processor available does not have the sufficient memory capacity to fit the most computational intensive subsystem. Therefore, the best partitioning scheme for achieving lowest system latency with the available computational hardware components may not be easily obtained. The generation of performance prediction reports can therefore provide a user with performance estimates of a partitioning scheme. The user can use the predictive reports as a basis for iterative partitioning trials to arrive at a partitioning scheme that achieves the user-specific goal of satisfying model design requirements in the implementation on the hardware platform.

Once a satisfactory partitioning scheme is reached, code can be generated for execution on the target hardware platform. A statistical report presenting the real-time operational characteristics of the multiple computational hardware components is generated. Optionally, the user performs final tuning of the final partitioning scheme based on the statistical report from actual execution on the target hardware platform. Any discrepancies between the statistical report from actual execution and the performance prediction report is provided to the report generator as feedback so that future generated performance prediction reports provides better predictive results.

Figure 1:
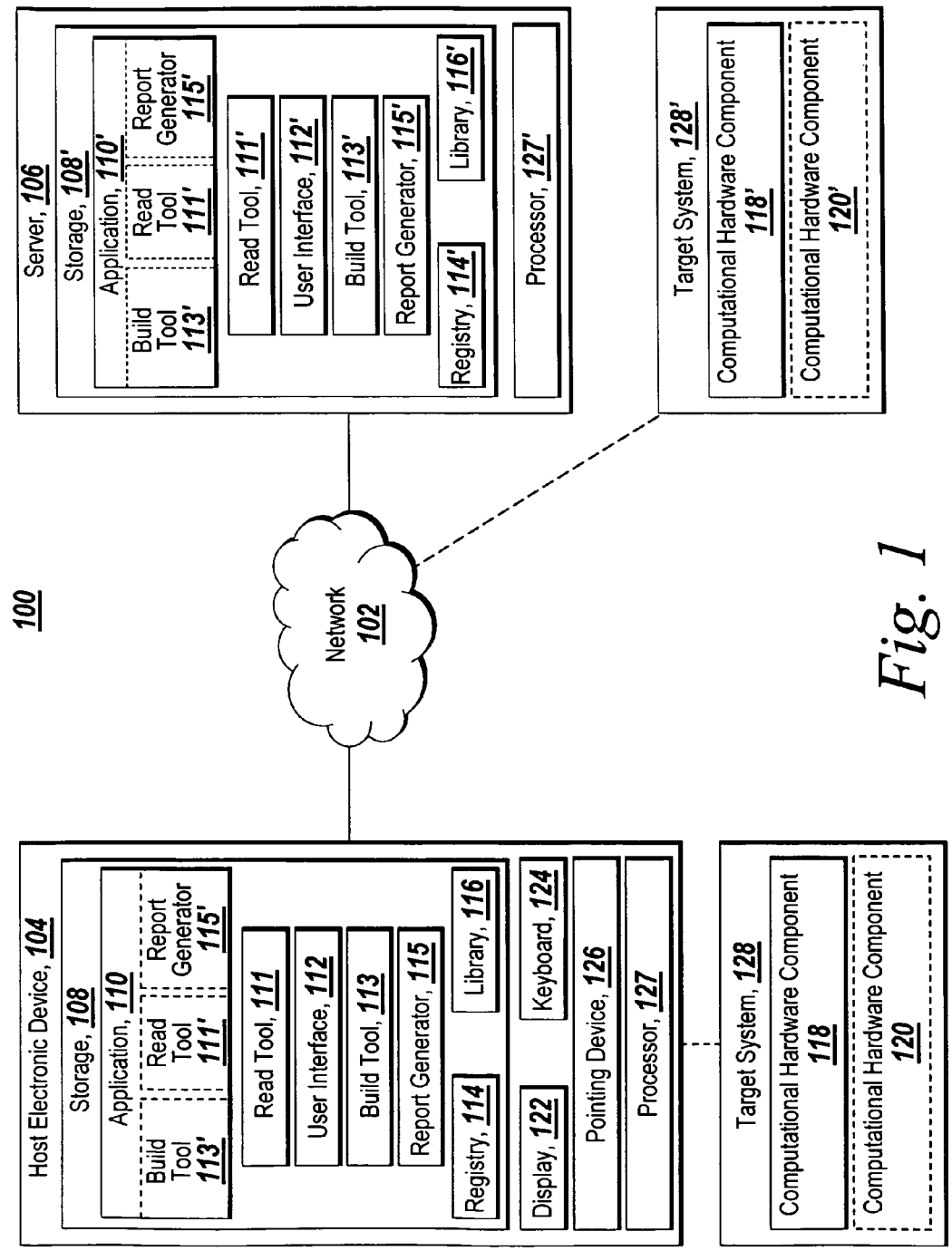
FIG. 1 is an exemplary non-distributed computing environment suitable for practicing the illustrative embodiment of the present invention.

FIG. 1 illustrates an environment that includes a host electronic device 104 with a target system 128 suitable for practicing an illustrative embodiment of the present invention. A computer system 100 includes a host electronic device 104, a network 102, such as the Internet, an intranet, or other suitable network either wired, wireless or a hybrid of wired and wireless, and, optionally, a server 106 or other electronic device. Host electronic device 104 also includes a display device 122 for use in rendering textual and graphical images, a pointing device 126 and a keyboard 124 for interacting with user interface 112, a processor 127 for running the application 110 and other programs, a storage device 108 for storing various items such as a library 116, a user interface 112, an application program 110, an read tool 111, a build tool 113, a registry 114 and a report generator 115. Target system 128 includes a first computational hardware component 118 and optionally a second computational hardware component 120.

The application program 110 will be described below for illustrative purposes as a block diagram modeling application such as Simulink® from The MathWorks, Inc. of Natick, Mass. Nevertheless, those skilled in the art will appreciate that the principles and concepts described below are equally applicable to other graphical modeling applications, such as LabView, System View, Signal Processing Workstation, HyperSignal, COSSAP, Angeles, Ptolemy and other like graphical model applications. Furthermore, those skilled in the art will also appreciate that the principles and concepts are equally applicable to non-graphical modeling applications as well.

In one embodiment of the present invention, the library 116 is a repository of blocks that exist in the graphical modeling environment provided by the application program 110. The registry 114 in conjunction with the user interface 112 allow a user to register with the application program 110 information describing the first and second computational hardware components 118 and 120. Those skilled in the art will appreciate that the illustration of the user interface 112, the registry 114, and the library 116 is merely illustrative and these elements can be physically or logically located in the application program 110. The electronic device 104 also includes a keyboard 124 and a pointing device 126, such as a mouse, trackball or lightpen for interfacing with the application program 110.

The user interface 112 programmatically registers with the registry 114 the various information describing the target system 128, wherein the information is inputted by a user or retrieved from a storage location within the storage device 108 or from the target system 128. Alternatively, registry 114 may obtain the information describing the target system 128 from an application programming interface (API) call to another application, from an integrated development environment (IDE), or via an interface to the target system 128 or other system. One of ordinary skill in the art will recognize that there are many ways registry 114 may obtain the information describing the target system 128 including the first and second computational hardware components 118 and 120 and various interfaces, and the examples given here are not meant to be limiting.

The registry 114 stores the registered information and build tool 113 receives the information of selected computational hardware component(s). Those skilled in the art will recognize that the read tool 111, build tool 113, report generator 115 may each be a separate program, like a plug-in, from the application program 110 or a tool in the application program 110. Additionally, read tool 111, build tool 113, and report generator 115 maybe be combined to become one or more programs or tools. Furthermore, those skilled in the art will recognize that the user interface 112 can take the form of a graphical user interface that provides a user of the system 100 with textual and graphical information to allow the user to browse and select computational hardware components, interfaces and their specification information, modify such information or create a new hardware target system profile. Those skilled in the art will appreciate that the user interface 112 is also implementable as a command line interface or other suitable interface that allows a user to register a computational hardware component with the application program 110.

FIG. 1 shows a server 106, with a storage medium 108' that includes an application 110', user interface 112', read tool 111', build tool 113', registry 114', and library 116'. FIG. 1 further illustrates a target system 128' with a first computational hardware component 118' and optionally a second computational hardware component 120'. Storage 108' indicates an alternative location for storage 108. Similarly, application 110' is an alternative location for application 110; user interface 112' is an alternative location for user interface 112, etc. In one embodiment, the server 106 coupled to the network 102 is adaptable to include a user interface 122' which enables a user to access registry 114, library 116 and an application program 110 running on processor 127.

In another embodiment, the server 106 coupled to the network 102 is adaptable to include an application program 110' and using the local registry 114 to register the processors' profiles and store the blocks used in the block diagram model in the library 116 on the client machine as well. In this manner, the application is on the server, but runs on the client. In still another embodiment, the server 106 coupled to the network 102 is adaptable to include a library 116', and a build tool 113' with a registry 114' working with the application 110 on the client. In this configuration, the application program resides on a client computer, but can be run on a server computer using the server's storage mediums and processing capabilities. Those skilled in the art will recognize that there are many other different configurations possible in a non-distributed computing environment for practicing the present invention.

Besides the information describing the computational hardware component(s), build tool 113 can also receive a user-defined partitioning scheme. Additionally, build tool 113 can evaluate the individual blocks in the block diagram model to obtain block attributes for use in dividing the block diagram model into partitions.

Block attributes are characteristics of a block such as, block name, data type, sampling time, the number of computations required, memory size, interface type (e.g. serial or parallel), the number of times the memory is accessed and the like. By way of example, Simulink® creates and stores block diagram models into model files with a .mdl file extension. Therefore, read tool 111 can read the .mdl file storing the specifics of all the blocks in the block diagram model, and determine for example, the computational requirements of each block, and the amount of data transfer there is between each block.

Read tool 111 can further determine latency and real-time related issues by reading associating data and account for these issues in partitioning the block diagram model. For example, latency associated with memory access durations by the multiple computational hardware components and data transfers times between them given the operational characteristics of the computational hardware components. Those skilled in the art will appreciate that there are many other parameters the read tool 111 may collect upon partitioning.

Once the read tool 111 has the information describing the one or more computational hardware components and the partitioning scheme from build tool 113, read tool 111 retrieves model attributes and provides the data to report generator 115. Read tool 111 may obtain the block diagram model by reading a block diagram model file or another file representing a preprocessed or intermediate representation of the block diagram model. In one embodiment, the block diagram model may be obtained by making an API call to another application, such as application 110.

In another embodiment, the application 110 may trigger the model reading process by sending the block diagram model to report generator 115 and requesting the report generator to generate a report. There are many different ways that read tool 111 may obtain information regarding the block diagram model. For example, read tool 111 can read from a file and obtain that for a specific block in the block diagram model that the block requires three thousand four hundred and eleven clock cycles to execute all the computation required within the block and the code size is two thousand and four hundred bytes. Alternatively, a function can be used to calculate exactly or approximately how many clock cycles or how much memory is needed for each block in the block diagram model given the information from the block diagram model itself and/or information describing the computational hardware component. The information can be the number of samples in an input signal, the data type of the input signal, and how long it takes to access these data in memory, and the like. For signal information, read tool 111 may obtain the corresponding attributes by reading a file that gives the data types of each input, the number of samples for each input, the size of each input, and other information related to a signal.

Alternatively, a formula can be used to calculate the total memory access time of a signal given information such as the number of samples of input and the memory access time (or number of wait states) of the memory. One skilled in the art will appreciate that there is many possible ways for read tool 111 to obtain information within a block diagram model to generate a performance prediction report. One skilled in the art will also appreciate that the functionality of read tool 111 may be built into application 110, build tool 113, or report generator 115.

After the read tool 111 obtains the information describing computational hardware components, the partitioning scheme, and the computational information of the block diagram model, read tool 111 provides the obtained data to report generator 115. Using the data, report generator 115 can generate a performance prediction report. The report generator 115 may map component-specific program code corresponding to a block to memory and estimate how much memory is needed for the block. The report generator 115 may further add up all the program code by memory bank to give a total estimate of how much memory is needed in total for a subsystem, a partition, or the whole model. The granularity of the report may be at any level that is supported by the block diagram model. For example, the report generator 115 may generate a report at the granularity level of a function if individual function information can be retrieved from the block diagram model. The report generator 115 may further compute predicted CPU usage of a block by using information on estimates of number of clock cycles required to execute all the computations needed within the block. Report generator 115 may further receive system requirements or user preferences, such as maximum system latency, maximum memory usage, maximum computational utilization, maximum interface loading, and the like, to include in predicting the performance of the one or more computational hardware components.

If multiple computational hardware components are used in the partitioning scheme, the interfaces used by the computational hardware components to communicate with each other are important to the performance of the partitioning scheme on the multiple computational hardware components. Information describing the interfaces would be registered with registry 114 if multiple computational hardware components are used. Using the model information provided by read tool 111 and interface information provided by registry 114, report generator 115 may compute predicted transfer time for each signal data from a first computational hardware component to a second computational hardware component. Report generator 115 may also compute the time the second computational hardware component waited for receiving data from the first computational hardware component.

The present invention can also be applied to co-pending U.S. application Ser. No. 11/021,760, the content of which is incorporated herein by reference. In one embodiment of the present invention, component interfaces are automatically generated for a target hardware platform from a block diagram model as described in the above referenced application, and report generator 115 generates a report presenting properties of the component interfaces generated from the block diagram model.

The partitioning scheme partitions the block diagram model into partitions. In one embodiment of the present invention, application 110 may provide a grouping and selection mechanism to group one or more blocks of the block diagram model into partitions. Application 110 may further provide a graphical representation of the partitions. For example, each partition may be highlighted with a certain color, shade or a box with a certain line type that visually groups the blocks that make up the partition. Alternatively, read tool 111 may provide the graphical representation of the partitions instead of application 110. There can be additional programs or tools that provide the partitioning mechanism and the examples listed here are not meant to limit the scope of the present invention.

The report generator 115 may further provide a predicted timeline of CPU usage and interface loading for each partition in a timing diagram. The report generator 115 may generate the performance prediction report displaying predicted memory and CPU usage and interface loading. A timing diagram showing the predicted timeline of CPU usage and interface loading for each partition may also be provided in the performance prediction report. One skilled in the art will appreciate that there are many aspects of the partitioning scheme the report generator can present in the performance prediction report as long as the aspects can be predicted using data obtained from the block diagram model, information describing the one or more computational hardware components, and the partitioning scheme, and the examples given here are not to be used to limit the scope of the present invention. One skilled in the art will also appreciate that the performance prediction report may be presented at a granularity level of many kinds, such as by function, by block, by subsystem, by partition, by the whole model, and the examples given here are not meant to be limiting the scope of the present invention.

The present invention can also be applied to co-pending U.S. application Ser. No. 11/019,044, the content of which is incorporated herein by reference. In one embodiment of the present invention, report generator 115 utilizes the memory mapping technique described in the above referenced application, and generates a report presenting the memory mapping of the block diagram model to several memory with different sizes and access speeds.

In one embodiment of the present invention, build tool 113 can generate component-specific executable code of the block diagram model using the partitioning scheme. In one aspect, build tool 113 divides the block diagram model into partitions and assigns each partition to a computational hardware component. During code generation, each partition is translated to a component-specific implementation of the assigned computational hardware component.

The computational hardware components 118 and 120 will be described below for illustrative purposes as microprocessors, which can be one of DSP, GPP, specific-purpose processor and the like. Other types of computational hardware components suitable for use in practicing the present invention includes microcontrollers, ASIC, FPGA, and other computational hardware components capable of carrying out a computation. Those skilled in the art will appreciate that computational hardware component 118 can be of the type DSP, whereas computational hardware component 120 can be of the type of FPGA and both of these computational hardware components can be used in one partitioning scheme. One skilled in the art will appreciate that the computational hardware components do not need to be the same or of the same type to practice the present invention.

During code generation, in one preferred embodiment, each partition is translated to a component-specific implementation. In operation, an automatic code generator reads the partitions of the block diagram model and associated input files to generate source code by translating the block diagram model into one or more source code files. Associated input files may include templates, commands, input parameters, configuration data, source code, data and class definition, or any other information that may be used by the automatic code generator to generate source code for the block diagram model. Associated input files can also include files to provide input to and configure the automatic code generator to generate source code files for a specific target hardware platform, for example, a DSP. By way of example, the automatic code generation can be discussed in terms of generating code with Real-Time Workshop® from a block diagram model generated by Simulink®. Real-Time Workshop® uses target language compiler script files, with a .tic file extension, as input files to the code generation process. The .tic files provide sections of programming instructions to be implemented for block references as they may be found in a block diagram model during the code generation process. The .tic files also can provide data and class definitions for data element references found in the block diagram model.

Additionally, the .tic files also include compiler directives, built-in functions and other code generation commands to direct Real-Time Workshop® during the code generation process. Simulink® creates and stores block diagram models into model files with a .mdl file extension. As part of the code generation process, Real-Time Workshop® reads in a .mdl model file and analyzes the model to generate an intermediate model file with an .rtw extension. This intermediate .rtw model file includes a hierarchical structure of records describing systems and their blocks and connections analyzed from a block diagram model of the .mdl file.

A language compiler called the target language compiler of Real-Time Workshop® works with .tic files and .rtw files to produce code. The target language compiler interprets a program that reads the intermediate model file description of a .rtw file. As the target language compiler encounter a record in the .rtw file, it uses directives in the .tic files corresponding to the record to direct the code generation process for the specific record. As such, the target language compiler works much like a text processor. For example, the target language compiler uses block .tic files, which specify the particular code for a block, to transform each block into code. When it reads a record in the .rtw file that references a block, the target language compiler applies code from the corresponding block .tic file to generate code for the block in source code files. Additionally, model wide .tic files are also used to provide input to the target language compiler for global customization of the code. Model wide .tic files may direct the target language compiler to generate main routines to provide entry points into the program, source code header files to setup data structures, and utility functions to support code for particular blocks. The block and model wide .tic files can be modified to generate customized code for blocks and to generate any desired global customizations to the code.

The source code files generated from the automatic code generator, such as Real-Time Workshop®, may include program instructions of a programming language, such as C, which may further be in a format and style following the ANSI/ISO C standard. Additionally, the source code files may be generated to include fixed-point or floating-point source code. The program instructions of the source code files may be generated to run on any operating system, such as a real-time operation system, or for a specific processor.

In another embodiment, instead of generating code from partitions, the automatic code generator can generate code for each block in the block diagram model. The code generated and associated files for each block can include not only block attributes but also functions, and operations the block performs. After each block is translated into code, build tool 113 groups the translated code into partitions according to the partitioning scheme of the block diagram model and assigns each partition to a computational hardware component.

Report generator 115 may generate a statistical report after code is run on the one or more computational hardware components. Report generator 115 may communicate with target system 128 and obtain real-time statistics via an interface. One example of such an interface is implemented by an API of the target system's IDE. The API is usually a programming interface accessible through C/C++, Basic, or other programming or scripting languages. For example, Texas Instruments Code Composer Studio allows C++ and Perl programs to communicate with its IDE.

In one embodiment of the present invention, code is inserted to measure processing time or data transfer time of a unit element of the block diagram model such as a block or a signal. In one aspect, code is inserted during code generation. Alternatively, code is inserted according to a user's preference after code generation. For example, a timer is set at the start of a block's program code and the timer is stopped at the end of the code; the processing time can then be calculated by finding out the time difference between the time the timer starts and the time the timer stops. The recorded times may then be stored in the target platform's memory where it can be retrieved later using a call to an API via an interface. This method can similarly be applied to measuring the transfer time of data from one component to another. This method can also be used to measure other time aspects that a user is interested in knowing. Memory usage statistics may be retrieved from the linker generated memory mapping file and the symbol table.

Figure 2:
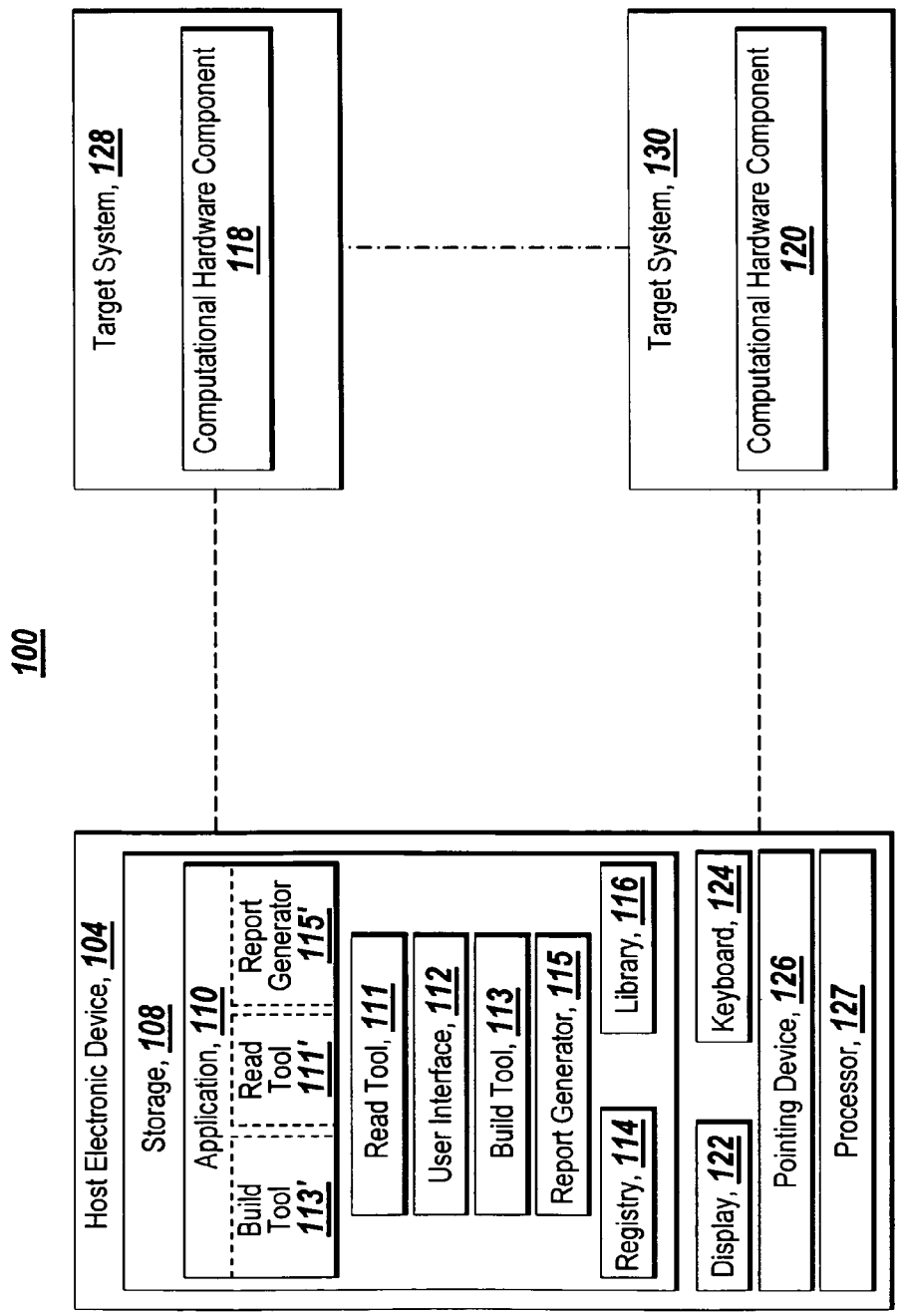
FIG. 2 is an alternative embodiment of FIG. 1 of the present invention.

FIG. 2 illustrates another illustrative embodiment of the present invention. In this embodiment, the first computational hardware component 118 and the optional second computational hardware component 120 are not on the same target system 128. In this embodiment, target system 128 includes the first computational hardware component 118, and a second target system 130 includes the second computational hardware component 120. Those skilled in the art will appreciate that the two target systems 128 and 130 do not need to include the same type of computational hardware components. For example, computational hardware component 118 can be a DSP, and computational hardware component 120 can be an ASIC, or they can be both GPP. Those skilled in the art will recognize that the present invention is equally applicable in a distributed computing environment.

Figure 3A:
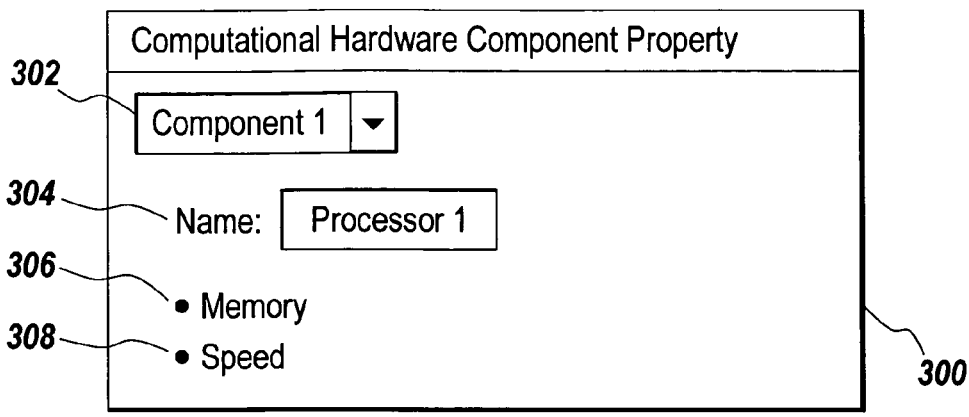
FIG. 3A is an exemplary graphical user interface for inputting parameters of computational hardware component property according to the teachings of the present invention.

FIG. 3A illustrates an exemplary graphical user interface for users to provide information describing the computational hardware components that build tool 113 or 213 use for partitioning the block diagram model using a user-defined partitioning scheme. In a computational hardware component property window 300, a computational hardware component drop down menu 302 is used to choose different computational hardware components. For each component, there is a name entry 304, memory entry 306, and speed entry 308. In the name entry 304, a user can provide a user-preferred name for the corresponding component. Upon clicking on the memory entry 306 and speed entry 308, another window is used for entering the properties for memory and speed of the component. In the preferred embodiment of the present invention, memory properties, such as memory size and access time, and speed properties, such as processor throughput quantified in MFLOPS or MIPS and clock rate, are provided to the build tool 113 or 213. The memory properties give the build tool 113 or 213 an idea of how much memory is available and how fast the memory can be accessed by its computational hardware component. The speed properties give the build tool 113 or 213 an idea of how fast the computational hardware component can process instructions.

Figure 3B:
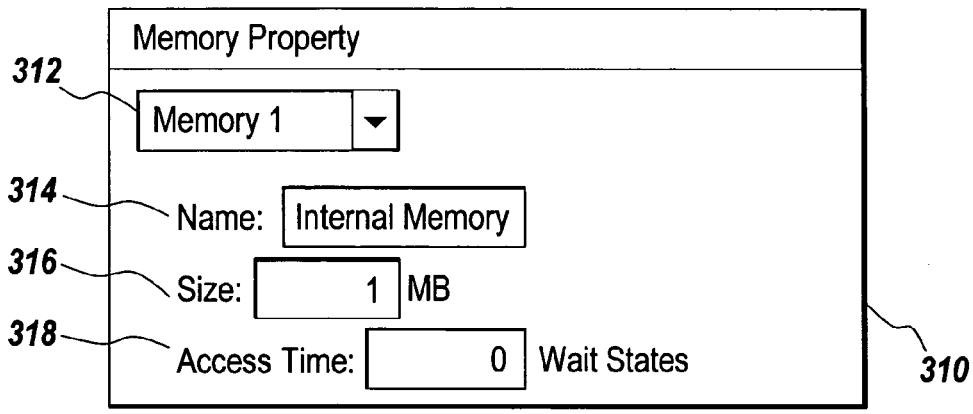
FIG. 3B is an exemplary graphical user interface for inputting parameters of memory property for a computational hardware component according to the teachings of the illustrative embodiment of the present invention.

FIG. 3B illustrates an exemplary window for users to enter memory properties. In a memory window 310, a memory drop down menu 312 is shown. The menu 312 lets users choose which memory the users want to enter the property information for. For each memory, there is name entry 314, size entry 316, and access time entry 318. In the illustrated example of FIG. 3B, "Memory 1" as specified in menu 312 is given the value "Internal Memory" in the name entry 314, "1" MB in the size entry 316, and "0" wait states in the access time entry 318. One skilled in the art will appreciate that the access time entry may be represented simply by a delay time, such as 2 milliseconds, instead of wait states. The delay time is measured with respect to data access speed in internal memory. The illustrative example given here is purely for illustrative purposes only and is not meant to be limiting the scope of the invention.

Figure 3C:
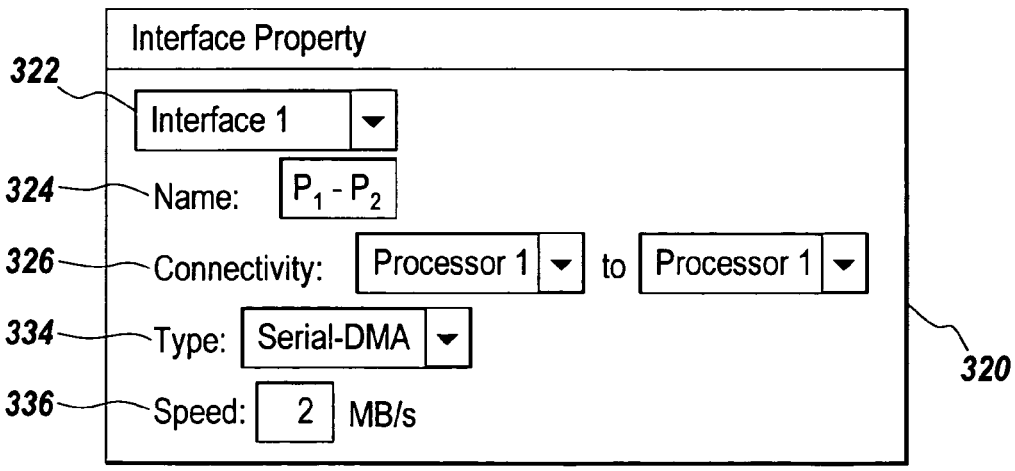
FIG. 3C is an exemplary graphical user interface for inputting parameters of interface property according to the teachings of the present invention.

If multiple computational hardware components are used in the partitioning scheme, the interfaces used between the computational hardware components are also important for evaluating a partitioning scheme. The type of interfaces used also effect the performance of the computational hardware components. FIG. 3C illustrates an exemplary graphical user interface that a user can use to enter properties of an interface. In interface property window 320, there are a drop down menu 322, a name entry 324, a connectivity entry 326, a type entry 334, and a speed entry 336. One skilled in the art will appreciate that these different entries need not be listed in such a way the illustrative example has shown, but rather the entries could also be displayed using different tabs or other graphical representation. In the illustrated example of FIG. 3C, "Interface 1" as specified in menu 322 is given the name "p1-p2" in the name entry 324. The connectivity entry 326 includes a first and second drop down menu 330 and 332 listing registered computational hardware components. In the given example, the connectivity for "Interface 1" is chosen to have "Processor 1" and "Processor 2" in the first drop down menu 330 and second drop down menu 332, respectively. In the illustrative example, "Interface 1" is further given "2" MB/s in the speed entry 336 and "Serial-DMA" from the drop down menu in type entry 334. One skilled in the art will appreciate that the interface may be an interface between a computational hardware component and an I/O device, or other interfaces within the target hardware platform.

Those skilled in the art will appreciate that information about the computational hardware components, interfaces, etc. can be entered using a command line interface or other suitable interface and are not limited to using a graphical user interface. The graphical user interface presented here are merely for illustrative purposes and a graphical user interface that utilizes selection tools other than drop down menus or text fields is also possible. Those skilled in the art will recognize that the computational hardware component properties depicted in FIG. 3A, the memory properties depicted in FIG. 3B, and the interface properties depicted in FIG. 3C are merely illustrative, and the listing of parameters in these figures and the specific examples given here are not meant to be limiting.

Figure 4:
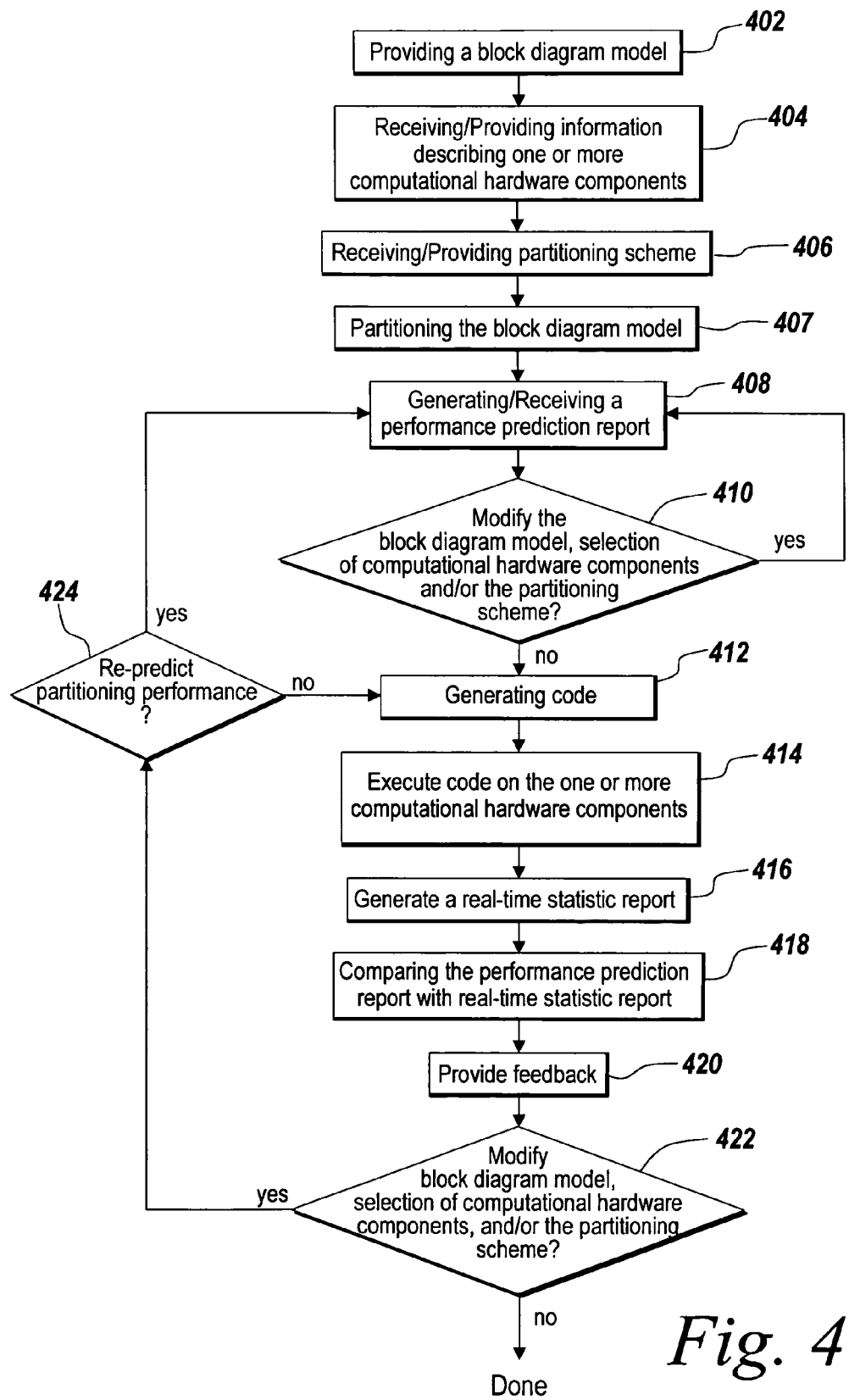
FIG. 4 is an exemplary flowchart that provides an overview of steps taken to practice one embodiment of the present invention in a block diagram modeling environment.

FIG. 4 illustrates an exemplary flowchart depicting the steps taken to practice the illustrative embodiment of the present invention in a block diagram modeling environment. Upon initiation of the application program 110 or at any time thereafter, a block diagram is provided in step 402. In step 404, information describing one or more computational hardware components is provided by a user or received by build tool 113. A partitioning scheme is also received by build tool 113 or provided by a user in step 406. The block diagram model is then partitioned using the partitioning scheme in step 407. Report generator 115 obtains information on the one or more computational hardware components and the partitioning scheme from build tool 113 and reads the block diagram model using the read tool 111. The report generator 115 analyzes data received and generates a performance prediction report in step 408, wherein the report presents one or more predicted operational characteristics of the one or more computational hardware components when executing a representation of the block diagram model based on the partitioning scheme. The generated report is then received by a user.

After a user is presented with the performance prediction report, the user can decide if any of the block diagram model, the selection of computational hardware components, and the partitioning scheme needs to be modified in step 410. If a modification is made, report generator 115 generates another performance prediction report based on the most updated block diagram model and the partitioning scheme in step 408. If no modification is made, build tool 113 generates code of the block diagram model in step 412 for execution by the one or more computational hardware components. Code is generated for each computational hardware component using the platform specific implementation. Code is then executed on the one or more computational hardware components in step 414. Report generator 115 then generates a statistical report in step 416 presenting one or more operational characteristics of the one or more computational hardware components.

Data for the statical report can be retrieved, for example, from an integrated development environment (IDE) that works with the computational hardware components, where the IDE has control of the execution of the computational hardware components (i.e. read memory, profile its execution, etc). For example, the user interface 112 and the build tool 113 can be adaptable and configurable to work with a COM compliant application that interfaces with the computational hardware components. For example, for memory usage, a linker outputs a file that shows memory usage as well as how code and data are mapped to physical memory. The report generator 115 may consult these files and extract desired usage information for generating a report. For execution performance, many IDE's include profiling tools to measure for example, how long a series of executions take by individual processor, and the report generator 115 can get this information through an API (application program interface), and generate reports accordingly. Alternatively, instrumentation code can be implemented in the embedded software with the build tool 113 to measure the real time partitioning performance. One skilled in the art will recognize that there are many other ways to obtain data to generate a statistical report. Reports can be in the form of a pie chart, a bar graph, an html file, and the like. One skilled in the art will recognize that the format of the report can be implemented in many different ways.

In step 416, the report generator 115 can compare the one or more operational characteristics of the one or more computational hardware components in the performance prediction report with the one or more operational characteristics of the one or more computational hardware components in the real time statistical report. In step 420, feedback may be provided to report generator 115 based on the comparison results of the two different reports so that report generator 115 may adjust its prediction methodology to provide better projection of a partitioning scheme. A user may decide if further modification is needed for any of the partitioning scheme, the block diagram model and the selection of computational hardware components in step 422. If yes, modification is made and a user can decide to generate a prediction report in step 424, or decide to generate code based on the modified partitioning scheme, block diagram model, and/or selection of computational hardware components in step 412.

Figure 5A:
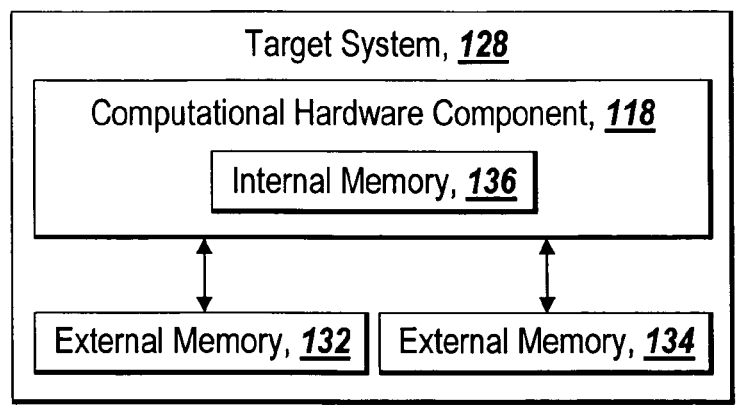
FIG. 5A illustrates an exemplary target system having one computational hardware component.

FIG. 5A illustrates an exemplary target system that is suitable to practice the present invention. As shown in FIG. 1 previously, target system 128 includes a computational hardware component 118. Additionally, computational hardware component 118 has internal memory 136, and has access to a first external memory 132 and a second external memory 134. Using the memory mapping technique from co-pending U.S. application Ser. No. 11/019,044, the present invention can produce a performance prediction report given information of computational hardware component 118, and specifically memory information of internal memory 136, the first external memory 132, and the second external memory 134. Memory information may contain memory size, access speed, and other like data. The performance prediction report may provide a user with insight of how well the memory mapping partitioning scheme is. The report may also provide an error message to inform a user of insufficient memory to place a piece of code or data on either internal memory 136, first external memory 132, or second external memory 134. The report may also report memory access delay caused by placing a specific piece of code or data in either first external memory 132 or second external memory 134 instead of internal memory 136, since internal memory is typically faster than external memory; however in most cases, it is not possible to place all the code and data in internal memory.

Figure 5B:
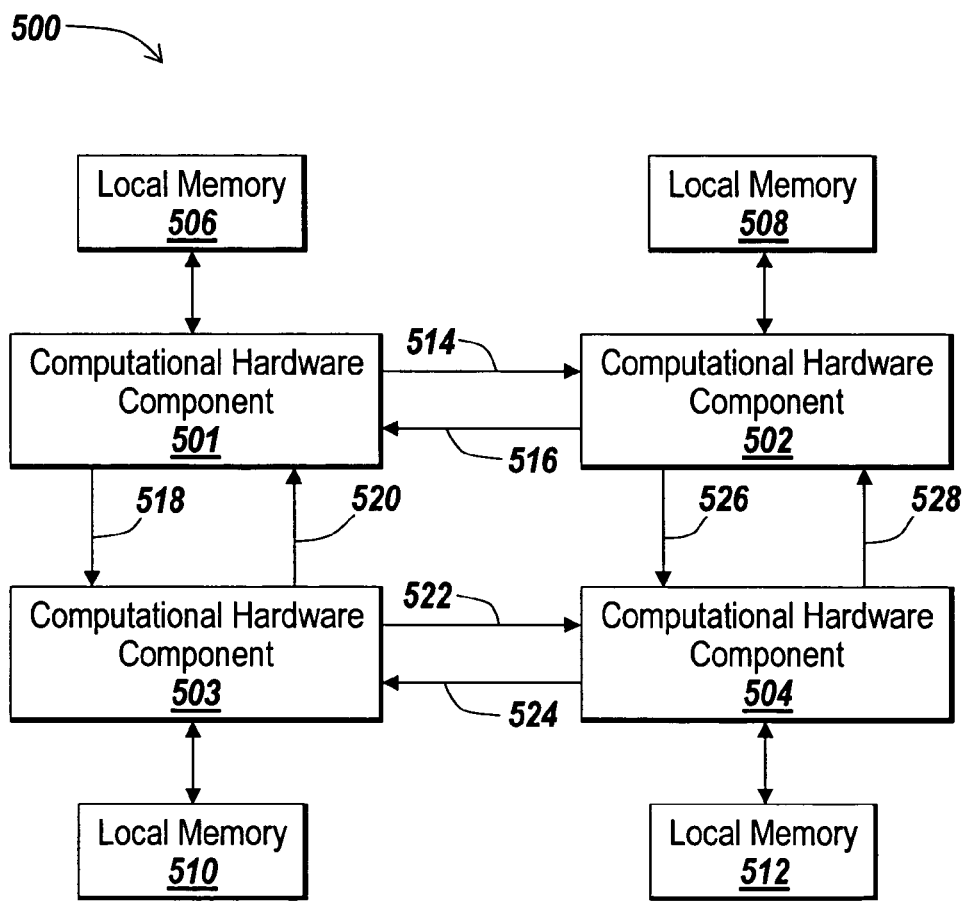
FIG. 5B illustrates an exemplary target system having four computational hardware components.

FIG. 5B illustrates another exemplary target system with multiple computational hardware components. Target system 500 has first computational hardware component 501, second computational hardware component 502, third computational hardware component 503, and fourth computational hardware component 504. The four computational hardware components can be of like or unlike processors. They can also be of other computational hardware components such as FPGA, ASIC, or the like. First, second, third and fourth computational hardware component 501, 502, 503, and 504 have direct access to first local memory 506, second local memory 508, third local memory 510, fourth local memory 512, respectively. First computational hardware component 501 may send second computational hardware component 502 data directly via communication link 514, and second computational hardware component 502 may send first computational hardware component data directly via communication link 516. First computational component 501 may communicates directly with third computational hardware component via communication links 518 and 520. Third computational hardware component 503 may communicates directly with fourth computational hardware component 504 via communication links 522 and 524. Fourth computational hardware components 504 may communicates with second computational hardware component 502 directly via communication link 526 and 528. Communication links 514 to 528 may be a serial link, a parallel link, or other like communication channel that is suitable for two computational hardware components to communicate with each other.

When two computational hardware components may not communicate directly with each other, they could communicate with each other via other components, such as first computational hardware component 501 communicates with fourth computational hardware component 504 through either second computational hardware component 502 or third computational hardware component 503. Optionally, all the computational hardware components may have access to a common bus (not shown) that provides them access to a common FIFO queue memory (not shown). Additionally, the computational hardware components may optionally have access to an I/O device, such as an analog-digital converter (ADC) (not shown). Two or more computational hardware components may optionally have access to a shared memory. One ordinarily skilled in the art will appreciate that the target system may include many different computational hardware components with different types of memories and different interfaces to communicate with each other or the different memories and the illustrative embodiment described herein is merely given as an example.

Given information describing each of the computational hardware components and interfaces, the present invention can generate a performance prediction report predicting one or more operational characteristics of the computational hardware components running code automatically generated from the block diagram model. The report can take a number of format and style, for example, it may be a table, a bar diagram, a pie chart, a histogram, or other suitable representation. In the preferred embodiment of the present invention, the report includes memory usage, computational utilization, interface loading, and timing diagram.

Figure 6A:
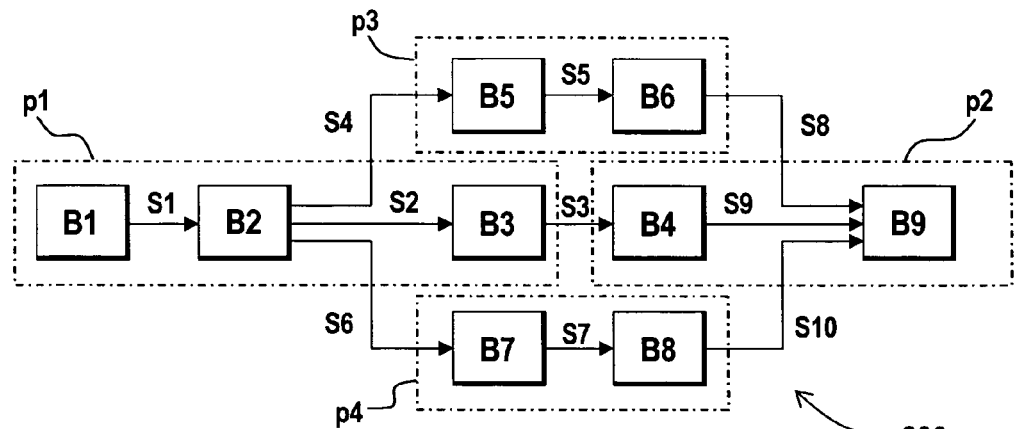
FIG. 6A illustrate an exemplary partitioning scheme of a block diagram model according to the teachings of the present invention.

FIG. 6A illustrates an exemplary partitioning scheme for a block diagram model 600, wherein p1 corresponds to a first partition assigned to the first computational hardware component 501, p2 corresponds to a second partition assigned to the second computational hardware component 502, p3 corresponds to a third partition assigned to the third computational hardware component 503, and p4 corresponds to a fourth partition assigned to the fourth computational hardware component 504. B1 to B9 each represent a block within the block diagram model 600. Furthermore, S1 to S10 represents signals between the various blocks B1 to B9. Signals between blocks within the same partition, such as S1 and S2, are not considered to result in signal delays. However, signals interconnects blocks associated with different partitions, such as S3, S4, S6, S8 and S10 are considered to result in signal delays due to the limitation of the interface used between the two partitions (computational hardware components).

Figure 6B:
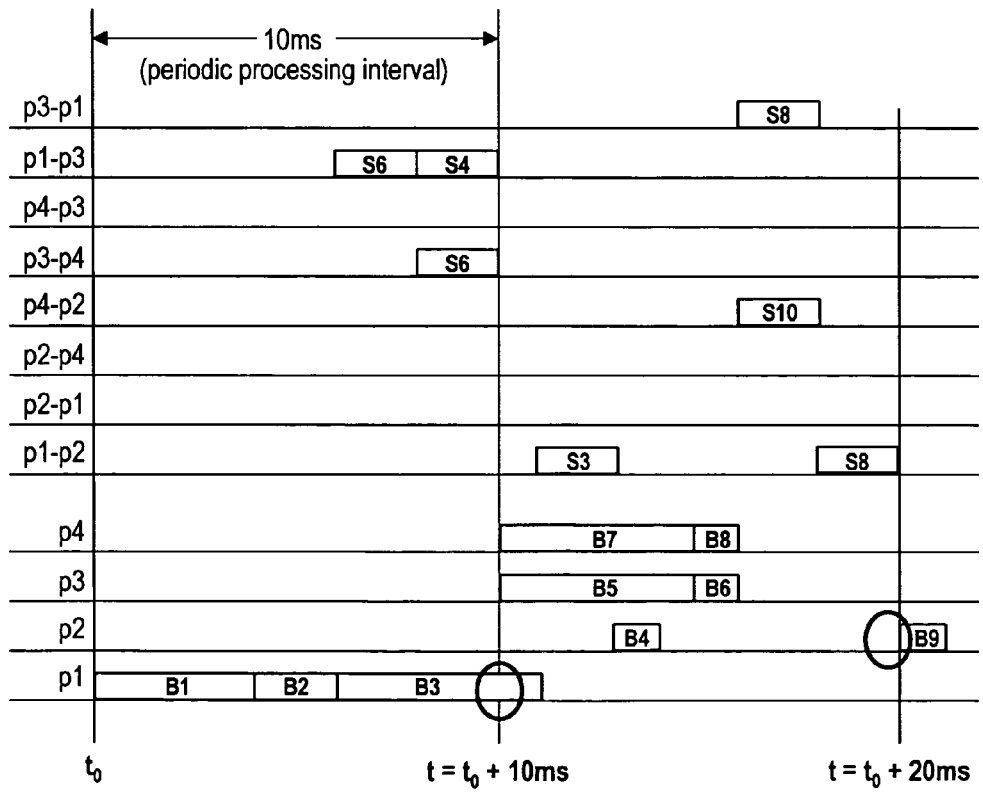
FIG. 6B illustrates an exemplary timing diagram corresponding to the exemplary partitioning scheme in FIG. 6A.

In the performance prediction report generated using the partitioning scheme shown in FIG. 6A, the report includes an exemplary timing diagram as shown in FIG. 6B. In the exemplary timing diagram, the horizontal axis shows time whereas the vertical axis shows partitions and the interfaces between the partitions. The timing diagram may include other interfaces other than the interfaces between the partitions. For example, an interface between an input device to a computational hardware component may be shown on the timing diagram to illustrate the amount of time needed to receive input data samples from the input device. In FIG. 6A, $t_0$ denotes the beginning of execution of the block diagram model and t denotes the time variable. Along the vertical axis, labels p1, p2, p3, and p4 represents the partitions corresponding to computational hardware component 501, computational hardware component 502, computational hardware component 503, and computational hardware component 504, respectively. Additionally, label "p1-p2" represents the interface for transferring data from p1 (computational hardware component 501) to p2 (computational hardware component 502). Similarly, label "p2-p1" means the interface for transferring data from p2 to p1; label "p2-p4" means the interface for transferring data from p2 to p4; . . . label "p3-p1" means the interface for transferring data from p3 to p1. In the exemplary timing diagram, B1 to B9 represents the time required for the assigned computational hardware component to perform computations defined by the block on the sample data received for the corresponding block B1 to B9 in FIG. 6A. For example, B1, B2, and B3 appear on the row for label p1, which means that B1, B2, and B3 are assigned to partition p1 which is to be processed by computational hardware component 501.

Of the signals S1 to S10 from FIG. 6A the signals that interconnect blocks in different partitions (computational hardware components) are represented in the timing diagram of FIG. 6B. The representation of a signal in the timing diagram indicates the transfer time required for data associated with the particular signal to transfer from one partition to another partition. For example, S10 is shown in the row for label "p4-p2", which means that S10 represents the time required for the signal to transfer from p4 (computational hardware component 504) to p2 (computational hardware component 502). For signals transfer between partitions (computational hardware components) that have a direct communication link, the signal utilizing the direct communication link for data transfer appear only once in the timing diagram and specifically only on the row of the label which represents the direct communication channel. S10 is one of such example signal.

However, the signals not utilizing a direct communication link to transfer data will appear more than once in the timing diagram. Specifically, it is shown on the corresponding row of the links which represent all the communication links that the signal utilizes to transfer data. S6 is such an example and it appears twice in the timing diagram. In FIG. 6A, signal S6 represents data transfer from partition p1 (computational hardware component 501) to partition p4 (computational hardware component 504). However, in FIG. 5B, there is no direct communication channel between computational hardware component 501 (p1) and computational hardware component 504 (p4). Therefore, for data transfer from computational hardware component 501 to computational hardware component 504, the transfer process has to go through either computational hardware component 502 or computational hardware component 503. In the referenced example, data on signal S6 is transferred from computational hardware component 501 to computational hardware component 504 via computational hardware component 503 (interfaces p1-p3 and p3 to p4). Hence, S6 appears twice in the timing diagram. Similar reason applies to S8 in this example.

Assuming the block diagram designed application samples the input signal at a rate of 10 milliseconds, and the system requirements for maximum latency is 20 milliseconds, the timing diagram as shown in FIG. 6B shows that computational hardware component 501 takes too long (more than 10 milliseconds) to process the assigned partition p1 and computational hardware component 502 does not finish processing partition p2 within the maximum latency required (20 milliseconds). In other words, both the real-time and latency requirements are violated since the processing time for p1 is too long (processing cannot keep up with input rate), and p2 is unable to finish processing within the 20 milliseconds window as specified by the maximum latency requirement. For ease of understanding, the timing diagram only shows the processing sequence that a specific input data follows, and one of ordinary skill in the art will recognize that each process is replicated in all periodic processing intervals. For example, when p1 is processing B1, p3 is processing B5 concurrently, but on a different input data set. Based on the performance prediction report, the partitioning scheme, the block diagram model, and/or the selection of computational hardware components may be changed.

Figure 7A:
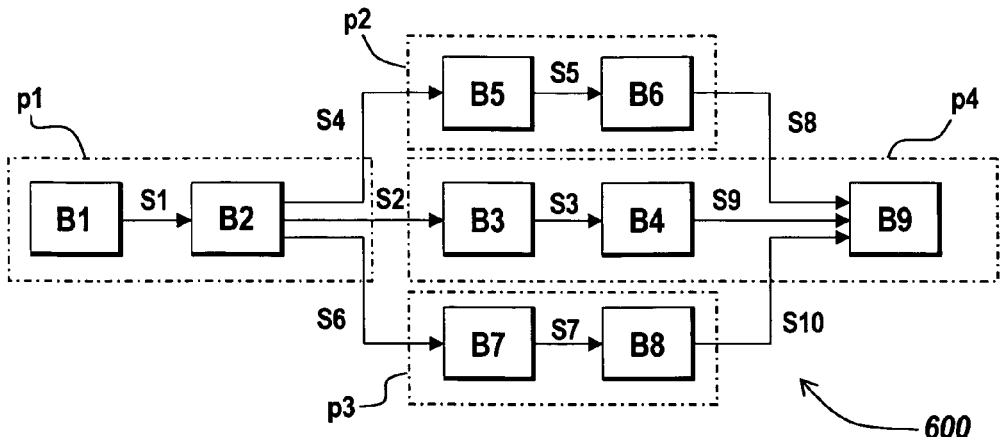
FIG. 7A illustrates another exemplary partitioning scheme of a block diagram model according to the teachings of the present invention.

Given that a user can elect to change the partitioning scheme, FIG. 7A shows a new partitioning scheme for the same block diagram model as shown in FIG. 6A. The partition p1 is reduced in size to process B1 and B2 only, and therefore might solve the problem of p1 being unable to keep up with real-time processing reported in FIG. 7B. p2, p3, and p4 are reassigned to process different blocks to minimize transfer of data between computational hardware components without direct communication channel (interface). Specifically, in the partitioning scheme as shown in FIG. 6A, S6 and S8 take extra transfer time because there is no direct communication channel between p1 (computational hardware component 501) and p4 (computational hardware component 504) or between p2 (computational hardware component 502) and p3 (computational hardware component 503). Therefore, the partitioning scheme as shown in FIG. 7A, S2 is the only signal data that require extra transfer time due to lack of direct communication interface between p1 and p4.

Figure 7B:
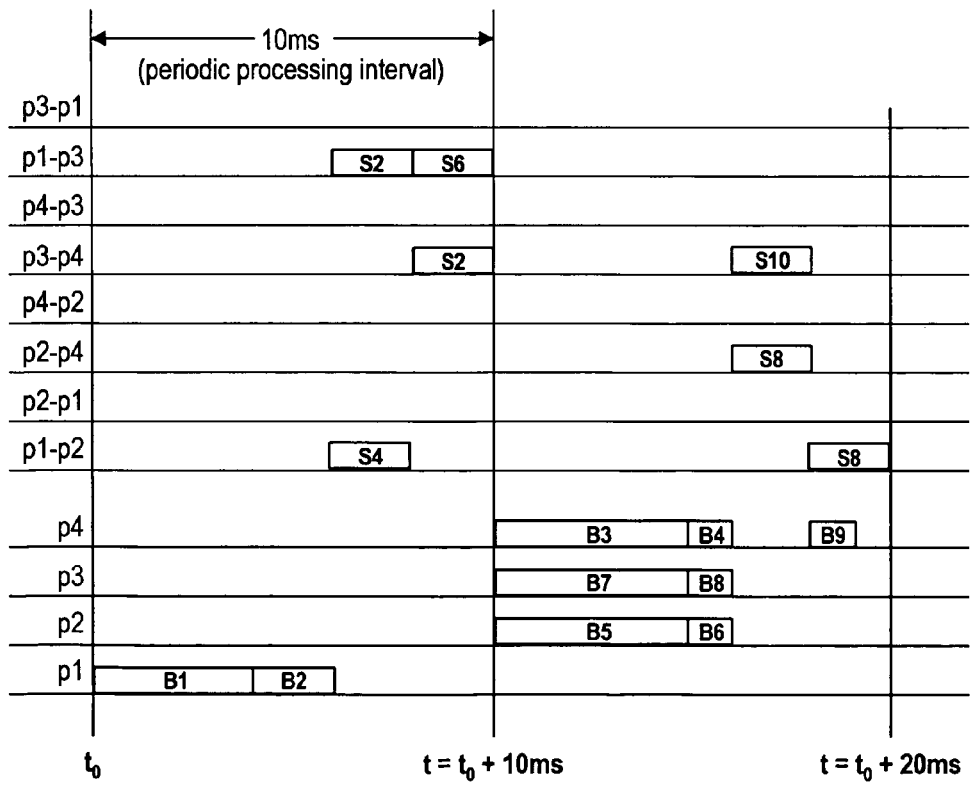
FIG. 7B illustrates an exemplary timing diagram corresponding to the exemplary partitioning scheme in FIG. 7A.

A performance prediction report based on the new partitioning scheme as shown in FIG. 7A is generated. Different aspects of the report are illustrated in FIG. 7B to FIG. 7G. FIG. 7B illustrates the new timing diagram and as illustrated, the problems illustrated in FIG. 6B have been solved using the new partitioning scheme. FIG. 7C to FIG. 7E illustrate an exemplary report in table format showing the memory usage, computational utilization, and interface loading, respectively, for each partition (computational hardware component). A user may read the report on memory usage to ensure none of the partition requires more than 100% of memory for all the code and data within a partition. Similarly, a user may read the computational utilization report to check if any partition utilizes more than 100% of the processing interval. Additionally, the user may look at the computational utilization report to try to distribute computational load required for each partition.

Alternatively, the performance prediction report may give indications graphically or by text that memory usage, computational utilization, or other aspects of the partitioning scheme is problematic instead of relying on a user to inspect data on the report. The performance prediction report may indicate insufficient memory in a computational hardware component for a segment of code generated from the block diagram model. The performance prediction report may also indicate excess CPU usage of a computational hardware component. The performance prediction report may also indicate failure to meet a system requirement. The performance prediction report may also indicate if a user preference is not met. For example, if a user has a preference of memory usage of less than 70% on Partition 1, the performance prediction report may report that there is insufficient memory in Partition 1 to place the segment of code generated for this partition to meet the user preference of less than 70% memory usage in Partition. The performance prediction report may also indicate if there is overloading of an interface. Overloading may occur if an interface is utilized for more than 100% of the processing interval or if the interface is utilized more than required by the system requirement or a user preference.

Referring to FIG. 7C, memory usage for each partition is shown based on the partitioning scheme shown in FIG. 7A. Methods for predicting memory usage and obtaining real-time memory usage statistics have been discussed above with respect to FIG. 1. Within each partition, program code size for each block, sample data of each signal, and other data that is stored in memory are reported. For example, memory usage for Partition 1 corresponding to p1 that is executed on computational hardware component 501 is reported that 1237 bytes of program code of block 1 (B1) is stored in local memory which has the capacity of 65536 bytes; in other words, 1.89% of the capacity of the local memory is used to store the 1237 bytes of code of block 1. Additionally, memory usage in bytes and percentage for block 2 (program code), S1 (signal data), S2 (signal data), S4 (signal data), S6 (signal data), stack, and constants are reported. Finally, adding up all memory usage in partition 1 results in total memory usage of 51971 bytes in size and a percentage of 79.30 of the total capacity of local memory for computational hardware component 501. For partition 2 to partition 4, blocks' program code, signal data, stack and constants are reported in a similar manner with a total memory usage calculated for each partition.

Referring to FIG. 7D, computational utilization for each partition is reported. As discussed above with respect to FIG. 1, computational utilization may be estimated by model information read by read tool 111 and hardware information registered with registry 114. In other words, given the number of clock cycles needed for processing a block and the clock rate of the computational hardware component processing the block, the amount of time that is spend on processing the block may be calculated. The methods for estimating required clock cycles for execution has been discussed with respect to FIG. 1. The real-time statistics of computational utilization may be retrieved as discussed with respect to FIG. 1 as well. In this figure, the percentage is calculated with respect to a processing interval, however, one skilled in the art will recognize that this processing interval repeats itself over and over again, and therefore the percentage also represents the percentage of computational power of the corresponding computational hardware component.

Referring to FIG. 7E, interface loading for transferring each signal through an interface is reported. For example, interface 1 represents signal transfer from p1 to p2 ("p1-p2"), and S4 and S8 are the signals that utilizes this interface. Within the processing interval of 10 milliseconds, which is defined by how fast input signals are sampled by the model, each signal, S4 and S8, takes a transfer time of 2 milliseconds to transfer 10,000 bytes for a total of 4.0 milliseconds to transfer 20,000 bytes of S4 and S8. The transfer time is estimated dividing the amount of data that needs to be transferred by the speed of the interface. The real-time statistics for transfer time of data may be measured using methods as discussed with respect to FIG. 1 above. The percentage usage of the interface is calculated using the amount of transfer time divided by the processing interval, which is 40% in this example of two signals, S4 and S8. Similarly, interface loading is estimated, measured and reported for other interfaces used in the partitioning scheme shown in FIG. 7A.

Figure 7F:
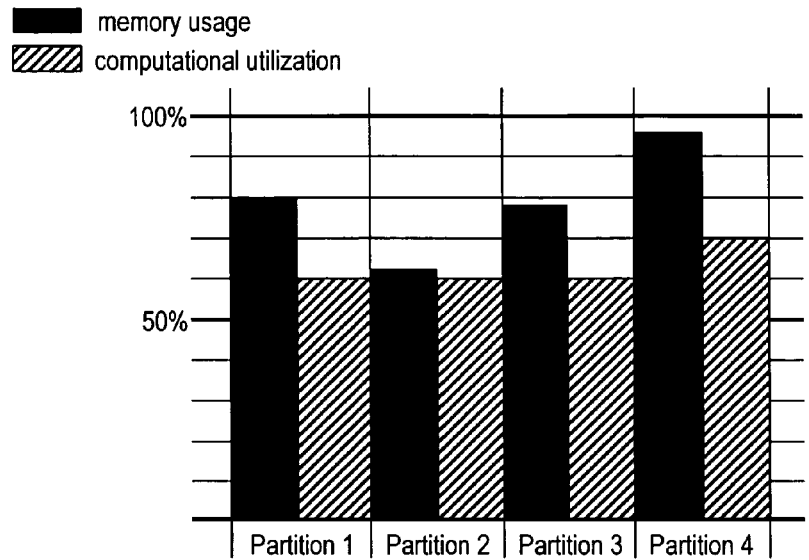
FIG. 7F illustrates an exemplary memory usage and computational utilization chart corresponding to the exemplary partitioning scheme in FIG. 7A.
Figure 7G:
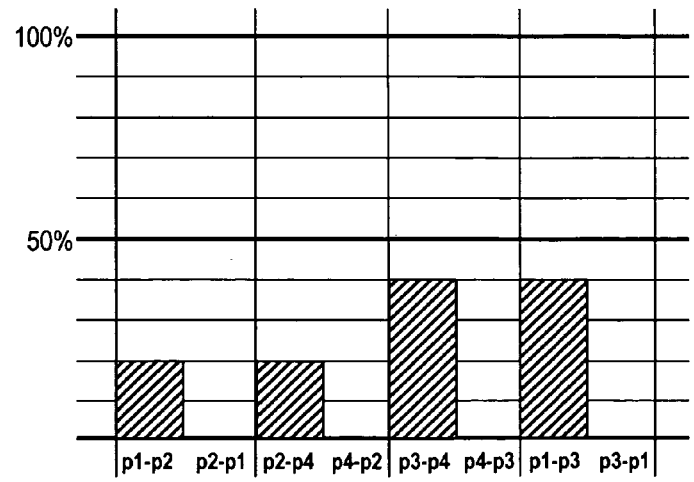
FIG. 7G illustrates an exemplary interface loading chart corresponding to the exemplary partitioning scheme in FIG. 7A.

FIG. 7F and FIG. 7G each illustrates an exemplary chart corresponding to the partitioning scheme as illustrated in FIG. 7A. The figures show the percentage of the total resource utilized in each partition. One skilled in the art will appreciate that the charts may show the individual resource usage for each block or other unit element in additional to or instead of the total usage.

Referring to FIG. 7F, total memory usage and computational utilization are shown for each partition. Partition 1 is shown to utilize approximately 80% of the total memory, and 60% of the computational power of the computational hardware component 501. These numbers correspond to memory usage report and computational utilization report shown in FIG. 7C and FIG. 7D, respectively. Assuming computational hardware components 501, 502, 503 and 504 are given identical hardware information initially for simplicity, then FIG. 7F shows that partition 4 requires the most memory usage and computational power. Therefore, a user may choose to assign partition 4 to the fastest available computational hardware component with sufficient memory. A user may also change the hardware information related to computational hardware 504 to match the real computational hardware component used and have a report generated by report generator 115 based on the information of the real target system.

Referring to FIG. 7G, total percentage of interface loading for each interface is shown. Interface "p1-p2" is shown to take up 40% of a processing interval. This data corresponds to what is reported in FIG. 7E. As shown by this figure, interface loading by interface "p1-p2", "p3-p4" and "p1-p3" are 40% and others are only as high as 20%. Therefore, if a user has several available interface types, the user can choose to select the fastest available ones for "p1-p2", "p3-p4" and "p1-p3" so that to shorten the total transfer time of signal data on these three interfaces and hence reduce the corresponding percentage of interface loading.

The statistical report may look exactly like the performance prediction report or it may be different in presentation or format. Therefore, FIG. 7B to FIG. 7G may represent exemplary statistical reports. One skilled in the art will recognized that the illustrative examples are given merely as an example and are not meant to limit the form or format of either the performance prediction report or the statistical report.

Many alterations and modifications may be made by those having ordinary skill in the art without departing from the spirit and scope of the invention. Therefore, it must be expressly understood that the illustrated embodiments have been shown only for the purposes of example and should not be taken as limiting the invention. Moreover, it is to be understood that the features of the various embodiment described herein are not mutually exclusive and can exist in various combination and permutations, even if such combination or permutation are not expressly made herein, without departing from the spirit and scope of the invention, which is defined by the following claims. These claims are to be read as including what they set forth literally and also those equivalent elements which are insubstantially different, even though not identical in other respects to what is shown and described in the above illustrations.

We claim:

1. A computer-implemented method for generating a report on a partitioning scheme for a block diagram model, the method comprising the steps of:
   providing information describing a target hardware platform;
   evaluating the block diagram model for obtaining one or more block attributes of the block diagram model, the block diagram model including one or more blocks each having at least one input signal or at least one output signal;
   providing the partitioning scheme for the block diagram model;
   predicting one or more operational characteristics of the target hardware platform when the hardware platform is executing code generated for the block diagram model, the predicting based on:
   the partitioning scheme, and
   the one or more attributes of the block diagram model; and
   generating, using a computer system, a performance prediction report, the prediction report including a result of the predicting.

2. The method of claim 1, wherein the one or more block attributes include one or more of a block name, data type, sampling time, number of computations, memory size and interface type associated with the one or more blocks of the block diagram model.

3. The method of claim 1, wherein the performance prediction report includes a timing diagram.

4. The method of claim 3, further comprising:
   representing time using a first axis of the timing diagram; and
   representing partitions of the block diagram model identified based on the partitioning diagram using a second axis of the timing diagram, wherein a partition includes one or more blocks.

5. The method of claim 4, wherein the second axis of the timing diagram further represents interfaces for transferring data between two or more partitions of the block diagram model.

6. The method of claim 5, wherein the memory information comprises a description of at least one of a size of a memory element and an access speed of the memory element.

7. The method of claim 4, wherein the timing diagram illustrates time required for the target hardware platform to perform computations defined by the one or more blocks of each partition.

8. The method of claim 4, wherein the timing diagram illustrates a time value at which the target hardware platform performs a computation defined by the one or more blocks of each partition.

9. The method of claim 4, wherein the timing diagram illustrates one or more signals that interconnect a first partition and a second partition.

10. The method of claim 9, wherein the timing diagram illustrates time required to transfer data associated with the one or more signals from the first partition to the second partition.

11. The method of claim 1, wherein the performance prediction report illustrates memory usage or computational usage of the target hardware platform textually.

12. The method of claim 1, wherein the performance prediction report illustrates memory usage or computational utilization of the target hardware platform graphically.

13. The method of claim 1, wherein the performance prediction report predicts the one or more operational characteristics of the target hardware platform when executing a representation of a selected block of the block diagram model.

14. The method of claim 1, wherein the performance prediction report predicts the one or more operational characteristics of the target hardware platform when executing a representation of a selected block of the block diagram model.

15. In an electronic device, a non-transitory medium holding computer executable instructions for generating a report on a partitioning scheme for a block diagram model, the medium holding one or more instructions for:
   providing information describing a target hardware platform;
   evaluating the block diagram model for obtaining one or more block attributes of the block diagram model, the block diagram model including one or more blocks each having at least one input signal or at least one output signal;
   providing the partitioning scheme for the block diagram model;
   predicting one or more operational characteristics of the target hardware platform when the hardware platform is executing code generated for the block diagram model, the predicting based on:
      the partitioning scheme, and
      the one or more attributes of the block diagram model; and
   generating, using a computer system, a performance prediction report that includes a result of the predicting.

16. The medium of claim 15, wherein the performance prediction report includes a timing diagram.

17. The medium of claim 16, further comprising one or more instructions for:
   representing time using a first axis of the timing diagram; and
   representing partitions of the block diagram model identified based on the partitioning diagram using a second axis of the timing diagram, wherein a partition includes one or more blocks.

18. The medium of claim 17, wherein the timing diagram illustrates time required for the target hardware platform to perform computations defined by the one or more blocks of each partition.

19. The medium of claim 1, wherein the performance prediction report illustrates memory usage or computational utilization of the target hardware platform textually or graphically.

20. In an electronic device, a system for generating a report on a partitioning scheme for a block diagram model, the system comprising:
   a processor for executing:
      an application for manipulating the block diagram model;
      a build tool receiving the partitioning scheme and information describing a target hardware platform, wherein the build tool evaluates the block diagram model for obtaining one or more block attributes of the block diagram model, the block diagram model including one or more blocks each having at least one input signal or at least one output signal; and
      a report generator, the report generator:
         predicting one or more operational characteristics of the target hardware platform when the hardware platform is executing code generated for the block diagram model, the predicting based on:
            the partitioning scheme, and
            the one or more block attributes of the block diagram model, wherein the one or more block attributes include one or more of block name, data type, sampling time, number of computations, memory size and interface type associated with a block of the block diagram model, and
         generating a performance prediction report that includes a result of the predicting.

* * * * *